(12) United States Patent
Seol

(10) Patent No.: US 6,780,768 B2
(45) Date of Patent: Aug. 24, 2004

(54) BONDING PAD FOR OPTICAL SEMICONDUCTOR DEVICE AND FABRICATION METHOD THEREOF

(75) Inventor: Jong-Chol Seol, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/234,734

(22) Filed: Sep. 3, 2002

(65) Prior Publication Data

US 2003/0042608 A1 Mar. 6, 2003

(30) Foreign Application Priority Data

Sep. 5, 2001 (KR) ........................................ 2001-54385

(51) Int. Cl.[7] .............................................. H01L 21/44
(52) U.S. Cl. ...................... 438/686; 438/689; 438/609; 438/656; 438/118; 257/744
(58) Field of Search .................................. 438/686, 608, 438/609, 656, 118, 628, 650, 685, 683, 624; 257/741–763

(56) References Cited

U.S. PATENT DOCUMENTS 6,008,137 A * 12/1999 Lee et al. .................... 438/724
6,188,452 B1 * 2/2001 Kim et al. ..................... 349/43
6,436,614 B1 * 8/2002 Zhou et al. .................. 430/321

* cited by examiner

*Primary Examiner*—Nathan J. Flynn
*Assistant Examiner*—Leonardo Andújar
(74) *Attorney, Agent, or Firm*—Cha & Reiter, L.L.C.

(57) ABSTRACT

The present invention provides a bonding pad for an optical semiconductor device, including: a first supplementary adhesive layer made of $Si_3N_4$, being formed on a semiconductor substrate; a bonding pad layer made of benzocyclobutene, being formed on the first supplementary adhesive layer; a second supplementary adhesive layer made of $Si_3N_4$, being formed on the bonding pad layer; and a metallic electrode layer formed on the second supplementary adhesive layer.

8 Claims, 4 Drawing Sheets

BONDING PAD FOR OPTICAL SEMICONDUCTOR DEVICE AND FABRICATION METHOD THEREOF

CLAIM OF PRIORITY

This application makes reference to and claims all benefits accruing under 35 U.S.C. Section 119 from an application entitled "A Bonding Pad for Electroabsorption-modulated Laser Module and A Fabrication Method Thereof" filed in the Korean Industrial Property Office on Sep. 5, 2001 and assigned Serial No. 2001-54385, the contents of which are hereby incorporated by reference.

BACKGROUND OF THE INVENTION

1. Field of the Invention

The present invention relates to optical semiconductor devices. More particularly, the present invention relates to a bonding pad for an optical semiconductor device and a fabrication method thereof.

2. Description of the Related Art

As semiconductor technologies continue to advance, deep submicron devices are now routinely manufactured. Due to a reduction in feature size, many formerly minor technical problems now become prominent and demand special consideration. For example, quality of connection between a bonding pad and a semiconductor substrate can seriously affect the reliability of an optical semiconductor device.

FIG. 1 is a front cross sectional view that diagrammatically illustrates a part of the electroabsorption-modulated laser module in the related art. Referring to FIG. 1, the electroabsorption-modulated laser module includes a submount 110, a laser chip 120 formed on the submount 110, being equipped with a laser 140 and a modulator 130, and a third and a fourth bonding pads 150 and 160, formed on the edge of the submount 110, for wire bonding with the laser chip 120. Although not shown, there are other elements like a carrier to which the submount 110 is connected, and some circuit elements for providing power to the laser chip 120.

The structure of the laser 140 is obtained by maturing a multiple quantum well on a thermally transformed holographic grating, and includes a second bonding pad 145 on the top end.

The modulator 130 is electrically separated from the laser 140, yet it has a similar structure to the laser, i.e., the grown multiple quantum well. On the top end, there is a first bonding pad 135 for wire bonding.

Here, a first wire 170 connects the first bonding pad 135 and the third bonding pad 150, while a second wire 180 connects the second bonding pad 145 and the fourth bonding pad 160.

FIG. 2 is a cross sectional view illustrating a configuration of the first bonding pad 135 shown in FIG. 1. The first bonding pad 135 includes a semiconductor substrate 210 made of indium-phosphide (InP), bonding pad layer 220 that is layered on the semiconductor substrate 210 and made of benzocyclobutene (BCB), a dielectric layer 230 made of $SiO_2$, and supplementary electrode layers 240 and 250 that are made of Ti-Au, and a Au metallic electrode layer 260.

Unfortunately however, the traditional first bonding pad 135 illustrated in FIG. 2 has a problem in that the bonding pad layer 220 easily falls off during the wire bonding. The poor adhesiveness results primarily because of the unstable $SiO_2$ molecular structure formed on the surface of the boding pad layer 220. The unstable bonding pad layer 220 consequently brings an interface separation to the dielectric layer 230 from the semiconductor substrate 210, or the bonding pad layer 220 from the semiconductor substrate 210.

SUMMARY OF THE INVENTION

It is an object of the present invention to provide a bonding pad for an optical semiconductor device with an improved adhesiveness by preventing unstable $SiO_2$ molecule structures from being formed on the surface of the bonding pad layer, and a fabrication method thereof.

To achieve the above objects, there is provided a bonding pad for an optical semiconductor device, the bonding pad including: a first supplementary adhesive layer made of $Si_3N_4$, being formed on a semiconductor substrate; a bonding pad layer made of benzocyclobutene, being formed on the first supplementary adhesive layer; a second supplementary adhesive layer made of $Si_3N_4$, being formed on the bonding pad layer; and a metallic electrode layer formed on the second supplementary adhesive layer.

Another aspect of the present invention provides a fabrication method of the bonding pad for an optical semiconductor device, the method including the steps of: forming a first supplementary adhesive layer on a supplementary layer; coating the upper portion of the first supplementary adhesive layer with adhesion promoter and thermally treating the coated layer; forming a bonding pad layer including the first supplementary adhesive layer and the adhesion promoter and thermally treating the bonding pad layer; forming a second supplementary adhesive layer on the bonding pad layer using the same material with the first supplementary adhesive layer; and forming a metallic electrode layer on the second supplementary adhesive layer.

Still another preferred embodiment of the present invention provides a fabrication method of the bonding pad for an optical semiconductor device, the method including the steps of: forming a first supplementary adhesive layer on a supplementary layer; forming a bonding pad layer on the first supplementary adhesive layer; performing a plasma process on the surface of the bonding pad layer; forming a second supplementary adhesive layer on the bonding pad layer using the same material with the first supplementary adhesive layer; and forming a metallic electrode layer on the second supplementary adhesive layer.

BRIEF DESCRIPTION OF THE DRAWINGS

The foregoing and other objects and features of the present invention will become more fully apparent from the following description and appended claims, taken in conjunction with the accompanying drawings. Understanding that these drawings depict only typical embodiments of the invention and are, therefore not to be considered limiting of its scope, the invention will be described with additional specificity and detail through use of the accompanying drawings in which:

DETAILED DESCRIPTION OF THE PREFERRED EMBODIMENT

Figure 1:
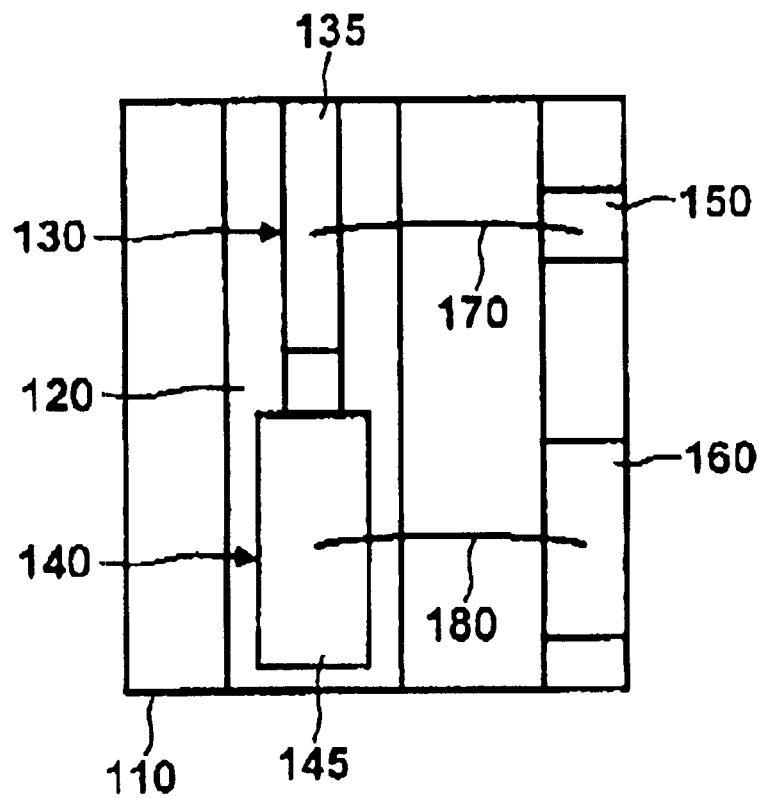
FIG. 1 is a schematic front cross sectional view showing a part of an electroabsorption-modulated laser module in the prior art.
Figure 2:
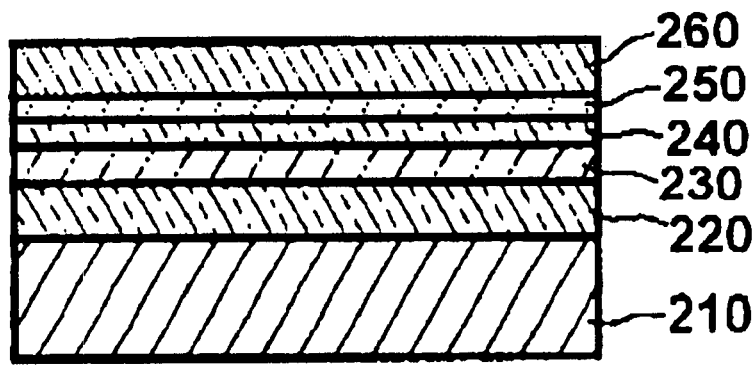
FIG. 2 is a cross sectional view showing a configuration of a first bonding pad shown in FIG. 1.

A preferred embodiment of the present invention will now be described with reference to the accompanying drawings.

In the following description, the same drawing reference numerals are used for the same elements even in different drawings. The matters defined in the description are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

Figure 5:
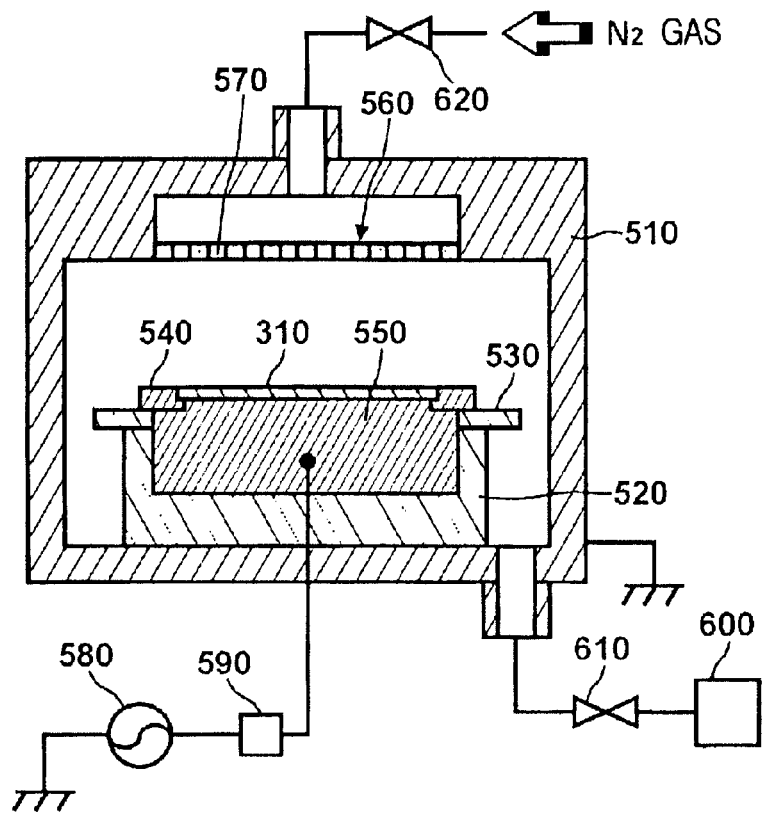
Figure 6:
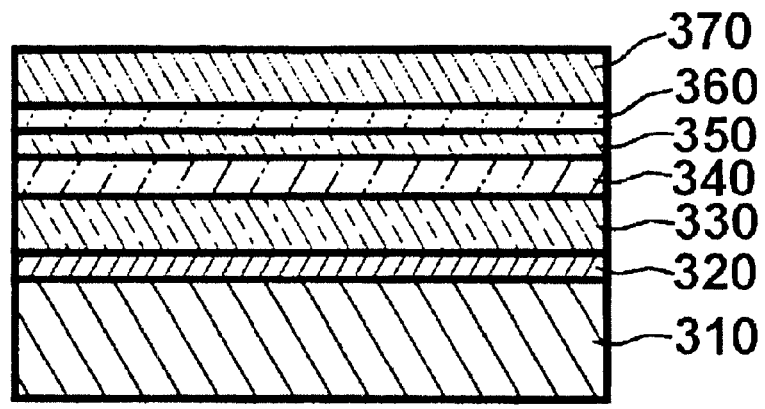
Figure 7:
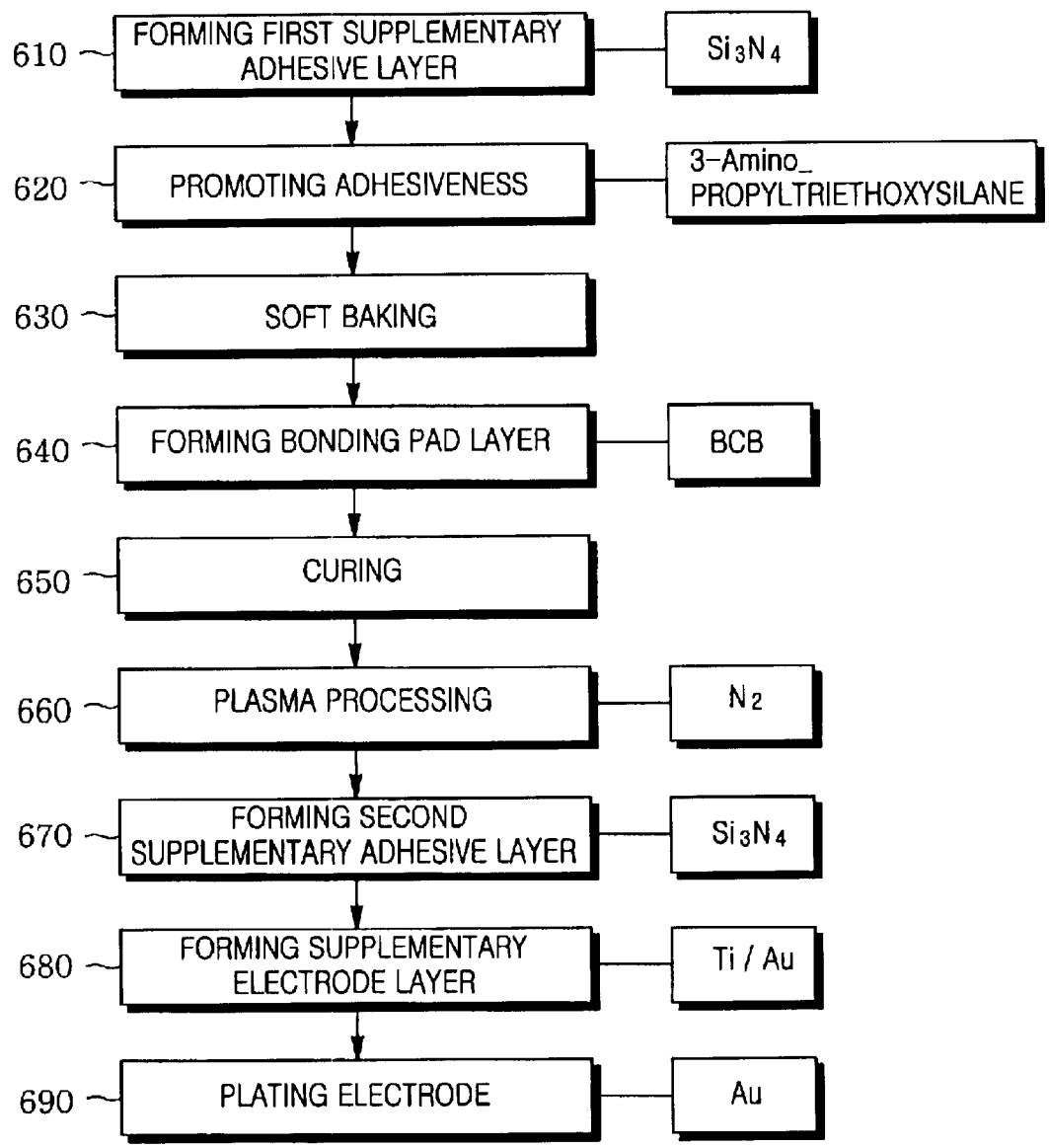

FIG. 7 is a flow chart illustrating a fabrication method of a bonding pad for an optical semiconductor device in accordance with a preferred embodiment of the present invention, and FIGS. 3 through 6 are explanatory diagrams for the fabrication method shown in FIG. 7. The detailed method of the present invention will be now explained with reference to FIG. 3 through FIG. 7.

Referring to FIG. 7, the fabrication method includes a series of procedures (a.k.a. steps), such as forming a first supplementary adhesive layer 610, promoting adhesiveness 620, a soft baking 630, forming a bonding pad layer 640, curing 650, plasma processing 660, forming a second supplementary adhesive layer 670, forming a supplementary electrode layer 680, and plating the electrode 690.

The procedure of forming the first supplementary adhesive layer 610 means forming the first supplementary adhesive layer 320 (shown in FIG. 3) using $Si_3N_4$ on a semiconductor substrate 310 made of indium-phosphide (InP).

The promoting adhesiveness 620 and the soft baking 630 processes are accomplished by coating the upper portion of the first supplementary adhesive layer 320 with an adhesion promoter made from 3-Amino-propyltriethoxysilane, and having the layer 320 undergo a thermal treatment at a low temperature, thereby improving the adhesiveness between the first supplementary adhesive layer 320 and the benzocyclobutene (BCB) bonding pad layer 330 made of that is put right on the first supplementary adhesive layer 320.

As aforementioned, the bonding pad layer 640 is formed by layering the bonding pad layer 330 made of BCB on the first supplementary adhesive layer 320. Given that the $Si3N_4$ molecules have relatively stable structure against the BCB molecules, thereby minimizing the formation of any unstable $SiO_2$ molecules on the surface of the bonding pad layer.

Figure 3:
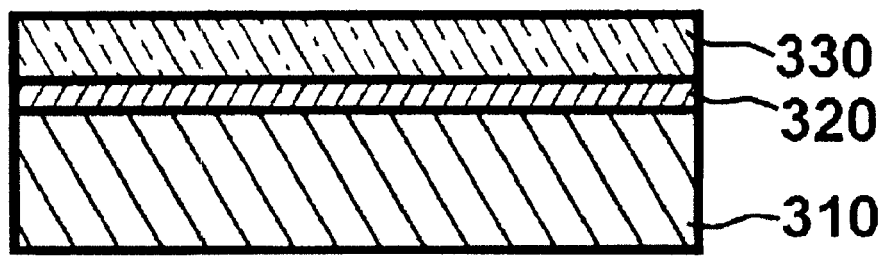
FIG. 3 through FIG. 7 diagrammatically show a fabrication method of a bonding pad for the electroabsorption-modulated laser module in accordance with a preferred embodiment of the present invention.

As shown in FIG. 3, the first supplementary adhesive layer made of $Si_3N_4$ is formed on the semiconductor substrate 310 made of InP to the thickness of 500 Å, and the bonding pad layer 330 made of BCB is put on the first supplementary adhesive layer 320 to the thickness of 5–6 micrometers.

The curing process 650 involves vaporization of the adhesion promoter's solvent in order to improve the adhesiveness between BCB by a little bit of curing. Typically, the curing process or the thermal treatment is conducted under 100° C. for 10 seconds. That is to say, the curing process 650 cures (or glassifies) BCB, by way of forming cross link between the BCB molecules. When the every BCB molecule is cross linked one another, the original phase BCB becomes absolutely solid. During the curing process on the BCB of the bonding pad layer 330, forming a cross link between the first supplementary adhesive layer 320 and Si3N4 molecules, a minute strain is sometimes generated because of the relieving effect of the adhesion promoter. However, the strain does not have a great impact on the adhesiveness itself.

Figure 4:
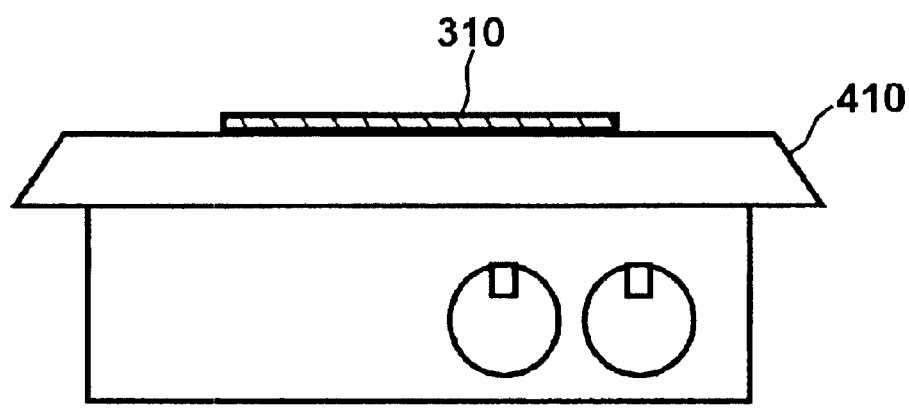

With reference to FIG. 4, the semiconductor substrate 310 of FIG. 3, layered by the first supplementary adhesive layer 320 and the bonding pad layer 330, is safely placed at the upper portion of a temperature adjustable hot plate 410. At this time, the upper portion of the hot plate 410 comes in contact particularly with the lower portion of the semiconductor substrate 310 on the opposite side, not the surface of the bonding pad layer 330. In addition, a heat chamber can be used instead of the hot plate 330. The difference between the heat chamber and the hot plate is that a user can optionally adjust the temperature inside of the chamber. Further, the inside of the chamber can be either vacuumed up or filled in with atmospheric gas, in order to perform the thermal treatment on the semiconductor substrate 310, maintaining the substrate blocked or sealed from outer atmosphere.

The plasma treatment process 660 carries out a plasma treatment on the surface of the bonding pad layer 330. Preferably used atmosphere gas for the process is nitrogen, which gives a slight damage on the surface of the bonding pad layer 330 to eventually minimize the strain due to the thermal expansion coefficient. As long as the BCB is glassified, it is always possible to have somewhat unstable adhesion state as the second supplementary adhesive layer 340 is being formed on the bonding pad layer 330. Further, even the presence of an extremely small amount of oxygen during the curing process 650 can cause very unstable $SiO_2$ molecules to be formed on the surface of the bonding pad layer 330. Therefore, the primary goals of the plasma treatment process 660 is to enhance adhesiveness between the unstable $SiO_2$ molecules formed on the surface of the glassified bonding pad layer 330 with the $Si_3N_4$ molecules for the second supplementary adhesive layer 340, and to minimize the degree of the strain brought by the thermal expansion coefficient.

FIG. 5 depicts a device embodied with the plasma treatment process 660. The device includes a conductive vessel 510; a lower electrode 550 disposed in a lower end of the inside of the conductive vessel 510; the semiconductor substrate 310 secured in the lower electrode 550; an insulating material 530 encompassing the lower electrode 550 and the semiconductor substrate 310; an upper electrode 560 disposed at the top end of the inside of the conductive vessel 510; a first and a second opening/closing valves 610 and 620; a vacuum pump 600, an RF generator 580; and a matcher 590.

The RF generator 580 is set up to generate as high as 800W frequency power, and the matcher 590 matches the output frequency of the RF generator 580 with pre-designated value. Meanwhile, the lower electrode 550 is provided with the high-frequency power by the RF generator 580 and the matcher 590.

The upper electrode 560 takes a mask form with a plurality of slits 570, and is electrically connected to the ground conductive vessel 510. In this way, an electric field with high intensity is formed between the upper electrode 560 and the lower electrode 550.

The nitrogen gas is injected into the conductive vessel 510 through the second opening/closing valve 620. The nitrogen gas then undergoes the plasma treatment by the electric field formed between the upper electrode 560 and the lower electrode 550.

In other words, the surface of the semiconductor substrate 310 secured inside of the lower electrode 550, or the surface of the bonding pad layer 330 undergoes the plasma treatment by the nitrogen gas that had already been through the plasma treatment.

The vacuum pump 600 evacuates gas inside of the conductive vessel 510 through the first opening/closing valve 610.

Referring back to FIG. 7, the second supplementary adhesive layer formation process 670 is accomplished by forming the second supplementary adhesive layer made of $Si_3N_4$ on the bonding pad layer 330 made of the BCB. The process is important especially for improving the adhesiveness of the second supplementary adhesive layer, together with the first supplementary adhesive layer, to the bonding pad layer 330.

The supplementary electrode layer formatting process 680 means forming supplementary electrode layers 350 and 360 made of Ti/Au, on the second supplementary adhesive layer 340. The subject process is a preliminary process for a better electrode plating process 690.

The electrode plating process 690 means forming Au metallic electrode layer 370 on the Ti/Au supplementary electrode layers 350 and 360. By doing so, the wire bonding is formed on the metallic electrode layer 370.

FIG. 6 is a cross sectional view of the bonding pad prepared by the fabrication method depicted in FIG. 7. As shown in FIG. 6, the second supplementary layer 340 made of $Si_3N_4$ is formed on the bonding pad layer 330 made of BCB to the thickness of 2200 Å, and the Ti/Au supplementary electrode layers 350 and 360 are formed on the second supplementary layer 340 to the thickness of 400 Å, respectively. Especially, the Ti/Au supplementary electrode layers 350 and 360 are formed to the thickness of 400 Å so that the resistance thereof is decreased below $2\Omega$, thereby helping the Au metallic electrode pad 370 to be uniformly plated on each supplementary layer 350 or 360. Moreover, the Au metallic electrode pad 370 is layered to the thickness of 3 micrometers. It is to be understood by a person o ordinary skill in the art that the thicknesses of the layers, and the resistance of the supplementary electrode are provided for purposes of illustration and not for limitation, and other thicknesses and ohmic values can be used that are within the spirit of the invention and the scope of the appended claims.

The bonding pad layer 330 of the present invention showed less than a 5% rate of bonding failure out of a 100% of bonding failure rate of the related art, given the same experiment conditions with the traditional method. Besides, the bonding pad layer 330 of the present invention marked 3.65 gf to the lowest at the wire pull test, which is relatively higher than 2.45 gf of MIL spec. Thus, it is obvious that the bonding pad layer of the present invention has much greater adhesiveness when compared with other bonding pad layers in the related art.

In conclusion, the bonding pad according to the present invention is advantageous in that it successfully minimizes the formation of $SiO_2$ molecules with unstable molecular structures on the surface of the boding pad layer, by interposing the bonding pad layer made of BCB between the $Si_3N_4$ supplementary adhesive layers.

Moreover, the coated boding pad with the adhesion promoter and then is thermally treated according to the present invention has much better adhesiveness, than known heretofore.

Finally, the bonding pad whose surface is treated by nitrogen and plasma prevents any unstable $SiO_2$ molecules from being formed on the surface of the bonding pad layer, and minimizes the strain due to the thermal expansion coefficient.

While the invention has been described in conjunction with various embodiments, they are illustrative only. Accordingly, many alternative, modifications and variations will be apparent to persons skilled in the art in light of the foregoing detailed description. The foregoing description is intended to embrace all such alternatives and variations falling with the spirit and broad scope of the appended claims.

What is claimed is:

1. A fabrication method of a bonding pad for an optical semiconductor device, the method comprising the steps of:

forming a first supplementary adhesive layer on a supplementary layer;

coating the upper portion of the first supplementary adhesive layer with adhesion promoter and thermally treating the coated layer;

forming a bonding pad layer including the first supplementary adhesive layer and the adhesion promoter and thermally treating the bonding pad layer;

forming a second supplementary adhesive layer on the bonding pad layer from a same material as the first supplementary adhesive layer; and forming a metallic electrode layer on an opposite surface of the second supplementary adhesive layer so that said bonding pad layer remains interposed between the first and second supplementary adhesive layers.

2. The method according to claim 1, wherein the formed first supplementary adhesive layer and the second formed supplementary adhesive layer both comprise $Si_3N_4$.

3. The method of claim 1, further comprising a step of forming a first supplementary electrode layer positioned between the second supplementary adhesive layer and the metallic electrode layer and a second supplementary electrode layer arranged on and in contact with said first supplementary electrode layer, said first and second supplementary electrode layers having a lower resistance than the second supplementary adhesive layer for a uniform formation of the metallic electrode layer.

4. The method according to claim 1, wherein the second supplementary adhesive layer comprises a semiconductor substrate.

5. A fabrication method of the bonding pad for an optical semiconductor device, the method comprising the steps of:

forming a first supplementary adhesive layer on a supplementary layer;

forming a bonding pad layer on the first supplementary adhesive layer;

performing a plasma process on the surface of the bonding pad layer;

forming a second supplementary adhesive layer on the bonding pad layer using the same material with the first supplementary adhesive layer; and forming a metallic electrode layer on the second supplementary adhesive layer so that said bonding pad layer remains interposed between the first and second supplementary adhesive layers.

6. The method of claim 5, further comprising a step of forming a first supplementary electrode layer positioned between the second supplementary adhesive layer and the metallic electrode layer and a second supplementary electrode layer arranged on and in contact with said first supplementary electrode layer, said first and second supplementary electrode layers having a lower resistance than the second supplementary layer for a uniform formation of the metallic electrode layer.

7. The method according to claim 6, wherein the first and second supplementary electrode layers have a resistance of approximately less than $2\Omega$.

8. The method according to claim 5, wherein the first supplementary adhesive layer and the second supplementary adhesive layer both comprise $Si_3N_4$.

* * * * *